United States Patent
Onda

(10) Patent No.: US 9,613,943 B2
(45) Date of Patent: Apr. 4, 2017

(54) SEMICONDUCTOR DEVICE HAVING OUTPUT BUFFERS AND VOLTAGE PATH COUPLED TO OUTPUT BUFFERS

(71) Applicant: Micron Technology, Inc., Boise, ID (US)

(72) Inventor: Takamitsu Onda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 14/725,864

(22) Filed: May 29, 2015

(65) Prior Publication Data

US 2015/0365077 A1    Dec. 17, 2015

(30) Foreign Application Priority Data

Jun. 17, 2014   (JP) ................. 2014-124193

(51) Int. Cl.
| | |
|---|---|
| H01L 27/02 | (2006.01) |
| G11C 7/10 | (2006.01) |
| G11C 5/02 | (2006.01) |
| G11C 11/4093 | (2006.01) |
| H03K 19/0185 | (2006.01) |
| G11C 29/02 | (2006.01) |
| H01L 27/092 | (2006.01) |

(52) U.S. Cl.
CPC ......... *H01L 27/0207* (2013.01); *G11C 5/025* (2013.01); *G11C 7/1057* (2013.01); *G11C 7/1066* (2013.01); *G11C 11/4093* (2013.01); *G11C 29/022* (2013.01); *G11C 29/028* (2013.01); *H01L 27/092* (2013.01); *H03K 19/018585* (2013.01); *G11C 2207/105* (2013.01)

(58) Field of Classification Search
None
See application file for complete search history.

(56) References Cited

U.S. PATENT DOCUMENTS

| | | | | |
|---|---|---|---|---|
| 5,604,710 A | * | 2/1997 | Tomishima | G11C 5/025 365/201 |
| 6,278,294 B1 | * | 8/2001 | Taniguchi | H03K 19/0013 326/57 |
| 6,583,972 B2 | * | 6/2003 | Verhaege | H01L 27/0266 361/56 |
| 6,636,166 B2 | * | 10/2003 | Sessions | H04L 25/4908 341/63 |
| 7,391,113 B2 | * | 6/2008 | Isa | H01L 23/50 257/737 |

(Continued)

FOREIGN PATENT DOCUMENTS

JP    08-212774    8/1996

*Primary Examiner* — Thomas J Hiltunen
(74) *Attorney, Agent, or Firm* — Wells St. John P.S.

(57) ABSTRACT

An apparatus includes first and second data pads arranged adjacently to each other in a first direction without an intervention of a pad therebetween, first and second output transistors coupled correspondingly to the first and second data pads and arranged adjacently to each other in the first direction and at least one contact plug through which a voltage is supplied to each of the first and second output transistors. The at least one contact plug is arranged between the first and second output transistors.

5 Claims, 18 Drawing Sheets

(56) References Cited

U.S. PATENT DOCUMENTS

| | | | | |
|---|---|---|---|---|
| 7,663,243 B2* | 2/2010 | Park | ...................... | H01L 24/06 257/773 |
| 8,203,860 B2* | 6/2012 | Chung | .................. | G11C 5/063 29/592.1 |
| 8,922,053 B2* | 12/2014 | Takeda | ................ | G11C 7/1057 307/149 |
| 8,957,459 B2* | 2/2015 | Morimoto | ........... | H01L 27/0207 257/206 |
| 9,362,908 B2* | 6/2016 | Ota | ................... | H03K 19/0005 |
| 2007/0069362 A1* | 3/2007 | Isa | .......................... | H01L 23/50 257/697 |
| 2009/0289499 A1* | 11/2009 | Sato | ........................ | H02J 1/00 307/18 |
| 2012/0001271 A1* | 1/2012 | Chae | .................. | H01L 29/4238 257/401 |

* cited by examiner

SEMICONDUCTOR DEVICE HAVING OUTPUT BUFFERS AND VOLTAGE PATH COUPLED TO OUTPUT BUFFERS

RELATED PATENT DATA

This application is based upon and claims the benefit of priority from Japanese patent application No. 2014-124193 filed on Jun. 17, 2014, the disclosure of which is incorporated herein in its entirely by reference.

1. Field of the Invention

This invention relates to a semiconductor device, in particular, a semiconductor device that has a voltage pad supplying a voltage to two or more output buffers.

2. Description of the Related Art

In many cases, a semiconductor device, such as DRAM (Dynamic Random Access Memory), has multiple pad electrodes arranged in one direction at the center or along the edge of a chip. For example, patent document 1 (U.S. Pat. No. 5,604,710) describes a semiconductor device having multiple pad electrodes arranged in one direction at the center of a chip. These multiple pad electrodes include a voltage pad supplied with a source voltage and a data pad through which data is input and output. The data pad is connected to a data output buffer that outputs data.

Because the data output buffer has a large drive capacity for outputting data outside, a large current flows through the data output buffer during its operation, which current is larger than a current flowing through other internal circuits. It is therefore necessary that a power supply path leading from the voltage pad to the data output buffer have smaller resistance and is desirable that a resistance difference between multiple current supply paths be smaller.

SUMMARY

In one embodiment, there is provided an apparatus that includes first and second data pads arranged adjacently to each other in a first direction without an intervention of any other pad, first and second output transistors coupled correspondingly to the first and second data pads and arranged adjacently to each other in the first direction and at least one contact plug between the first and second output transistors to supply a voltage to each of the first and second output transistors.

In another embodiment, there is provided an apparatus that includes first and second data pads, first and second voltage pads respectively supplied with pull-up and pull-down voltages, first and second pull-up transistors respectively coupled to the first and second data pads, first and second pull-down transistors respectively coupled to the first and second data pads, a first voltage supply path and a second voltage supply path. The first and second voltage pads are arranged in line in a first direction to sandwich the first and second pads. The first and second pull-up transistors are arranged in line in the first direction. The first and second pull-down transistors are arranged in line in the first direction. The first voltage supply path includes at least one first contact plug one end of which is coupled to the first voltage pad and the other end of which is coupled in common to the first and second pull-up transistors and the at least one first contact plug is arranged between the first and second pull-up transistors. The second voltage supply path includes at least one second contact plug one end of which is coupled to the second voltage pad and the other end of which is coupled in common to the first and second pull-down transistors and the at least one second contact plug is arranged between the first and second pull-down transistors.

In still another embodiment, there is provided an apparatus that includes first and second data pads arranged adjacently to each other, third and fourth data pads arranged adjacently to each other, a first voltage pad arranged between the first and second pads and the third and fourth pads, first and second output drivers provided correspondingly to the first and second data pads, third and fourth output drivers provided correspondingly to the third and fourth data pads and a first voltage supply path. The first voltage supply path includes an upper level wiring connected to the first voltage pad, a first lower level wiring coupled at least to the first and second output drivers, a second lower level wiring coupled at least to the third and fourth output drivers, at least one first contact plug connecting the upper level wiring and first lower level wiring and at least one second contact plug connecting the upper level wiring and the second lower level wiring. The at least one first contact plug is arranged between the first and second output drivers and the at least one second contact plug is arranged between the third and fourth output drivers.

DETAILED DESCRIPTION OF THE EMBODIMENTS

Preferred embodiments of the present invention will now be described in detail with reference to drawings.

Figure 1:
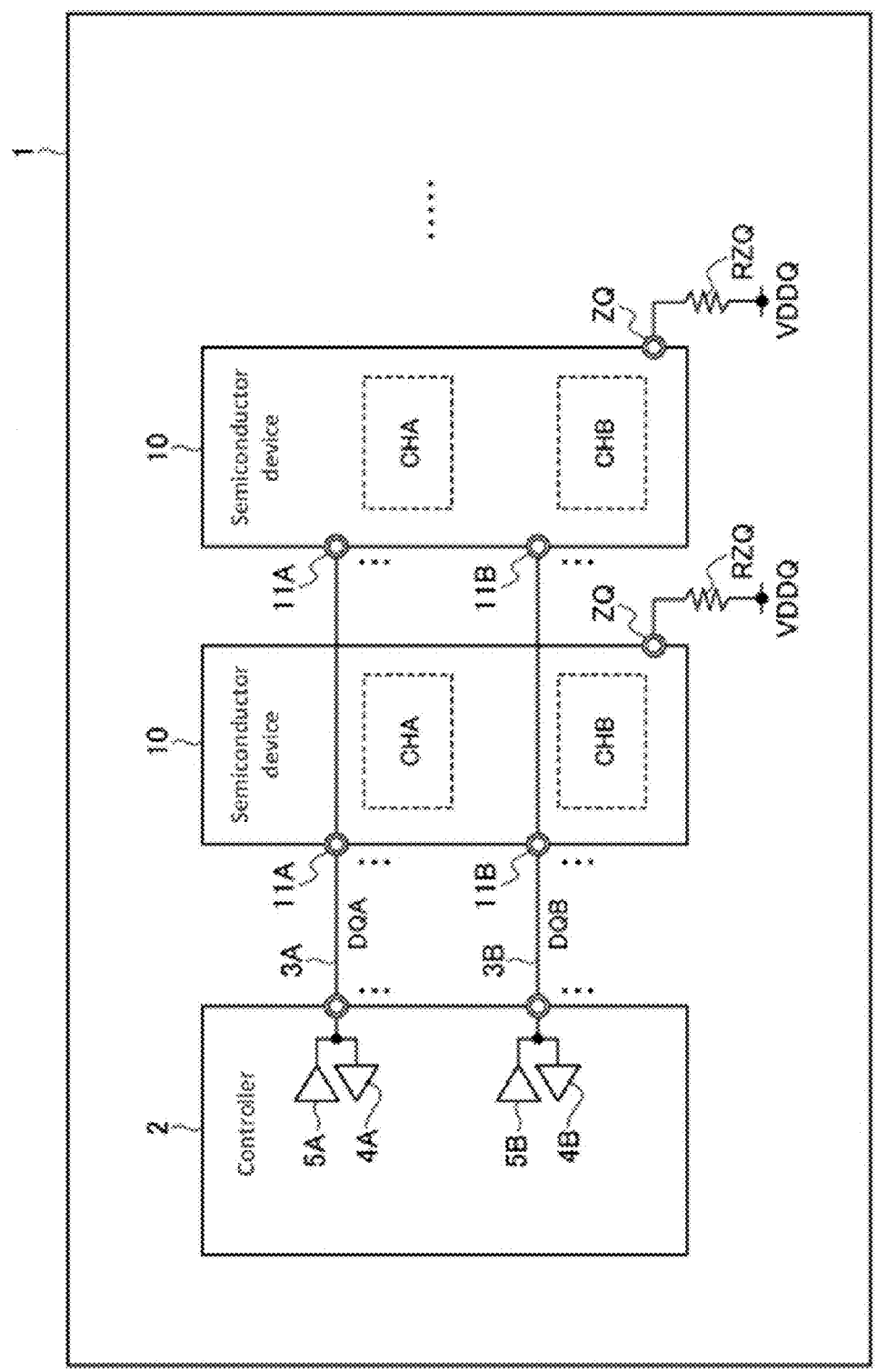
FIG. 1 is a block diagram of a system including a semiconductor device according to a preferred embodiment of the present invention.

FIG. 1 is a block diagram showing a configuration of a system 1 including a semiconductor device 10 according to a preferred embodiment of the present invention.

The system 1 of FIG. 1 includes multiple semiconductor devices 10 and a controller 2 that controls them. Each semiconductor device 10 is a DRAM packaged on a single semiconductor chip (the application form of the semiconductor device 10 is not limited to the DRAM. Volatile memories such as SRAM and non-volatile memories such as Flash memory, STT-RAM, FeRAM, PCRAM are applicable.). Each semiconductor device 10 has two channels CHA and CHB to which different groups of pad electrodes are assigned, respectively.

Read data DQA read out from the channel CHA of each semiconductor device 10 is output via a data pad 11A. The data pad 11A is connected to a data bus 3A, through which the read data DQA read out from the channel CHA is transferred to the controller 2. The controller 2 has an input buffer 4A for the channel CHA and therefore takes in the read data DQA via the input buffer 4A. In the process reverse to the above process, write data DQA to be written to the channel CHA is transferred by an output buffer 5A of the controller 2 to the data bus 3A and is further transferred through the data bus 3A to the data pad 11A of the semiconductor device 10.

Read data DQB read out from the channel CHB of each semiconductor device 10 is output via a data pad 11B. The data pad 11B is connected to a data bus 3B, through which the read data DQB read out from the channel CHB is transferred to the controller 2. The controller 2 has an input buffer 4B for the channel CHB and therefore takes in the read data DQB via the input buffer 4B. In the process reverse to the above process, write data DQB to be written to the channel CHB is transferred by an output buffer 5B of the controller 2 to the data bus 3B and is further transferred through the data bus 3B to the data pad 11B of the semiconductor device 10.

It is unnecessary that the semiconductor device of the present invention always be a semiconductor device capable of data input (write operation). Like a ROM-based semiconductor memory device, the semiconductor device may be capable of only data output (read operation). Each channel has a data path defined by the data pad, data bus, and input and output buffers, and this data path is not limited to a single path but may consist of multiple paths.

The semiconductor device 10 is provided with a calibration terminal ZQ. Each semiconductor device 10 is provided with one calibration terminal ZQ, which is therefore shared by the channels CHA and CHB. The calibration terminal ZQ is connected to a source voltage node VDDQ via a reference resistor RZQ disposed on a memory module board or motherboard. The reference resistor RZQ is a resistance that is referred to when a calibration operation is carried out. It is not essential for the present invention that only one calibration terminal ZQ is provided for two channels. The calibration terminal ZQ may be provided for each channel.

Figure 2:
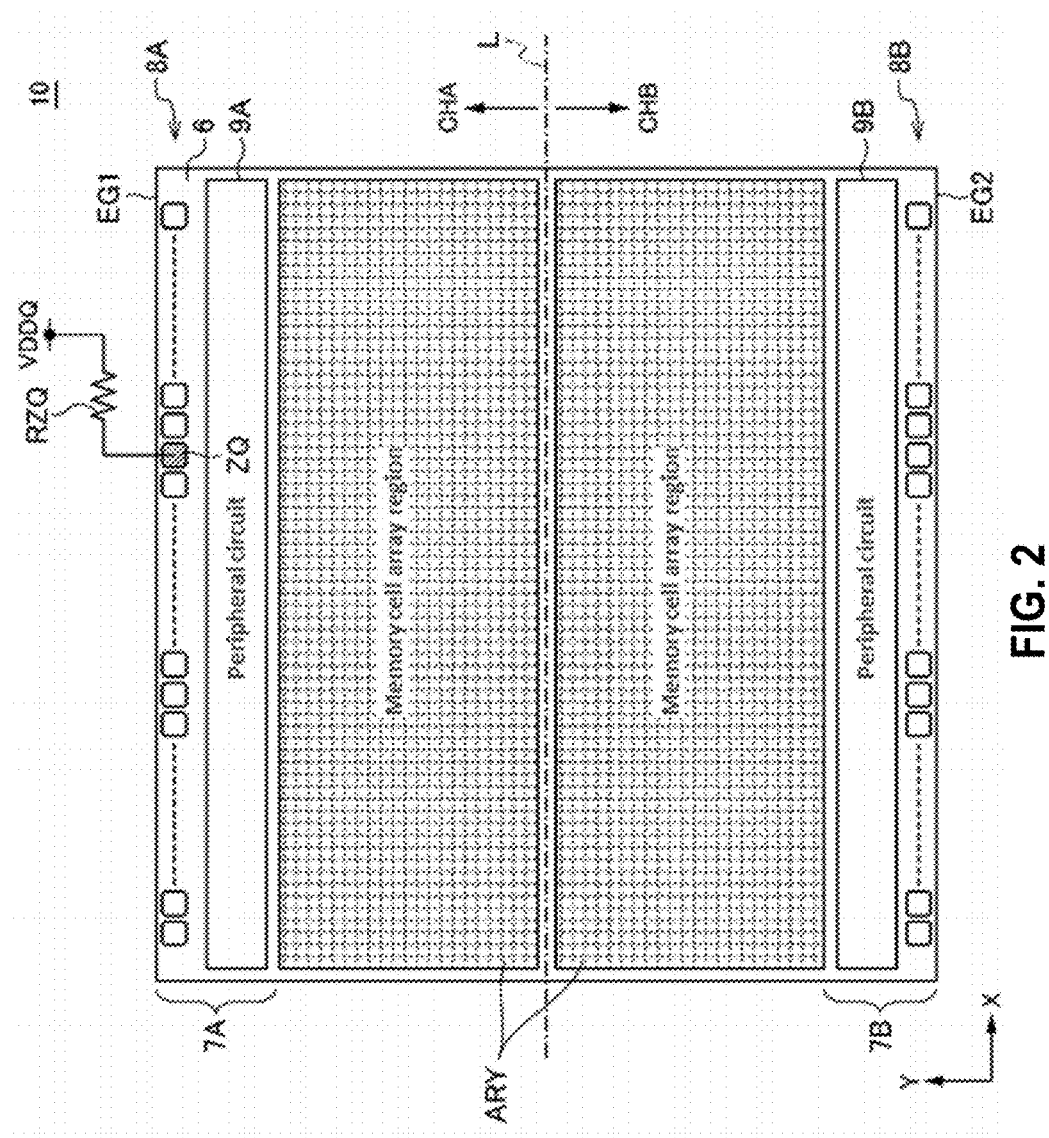
FIG. 2 is a diagrammatical plan view of a layout of a semiconductor device 10.

FIG. 2 is a diagrammatical plan view of a layout of the semiconductor device 10.

As shown in FIG. 2, the semiconductor device 10 is packaged on a substrate 6 that is rectangular in a plan view. The channels CHA and CHB are arranged respectively in two divided areas on both sides of a border line L dividing the substrate 6 into the divided areas in the Y direction. The substrate 6 has a peripheral region 7A formed along one edge EG1 of the substrate 6 in its Y direction, a peripheral region 7B formed along the other edge EG2 of the substrate 6 in its Y direction, and memory cell array regions ARY sandwiched between both peripheral regions.

A pad line 8A and a peripheral circuit 9A that belong to the channel CHA are arranged in the peripheral region 7A, while a pad line 8B and a peripheral circuit 9B that belong to the channel CHB are arranged in the peripheral region 7B. Memory cell arrays included in the channels CHA and CHB are arranged in the memory cell array regions ARY. The pad line 8A includes the calibration terminal ZQ, which is shared by the channels CHA and CHB.

Figure 3:
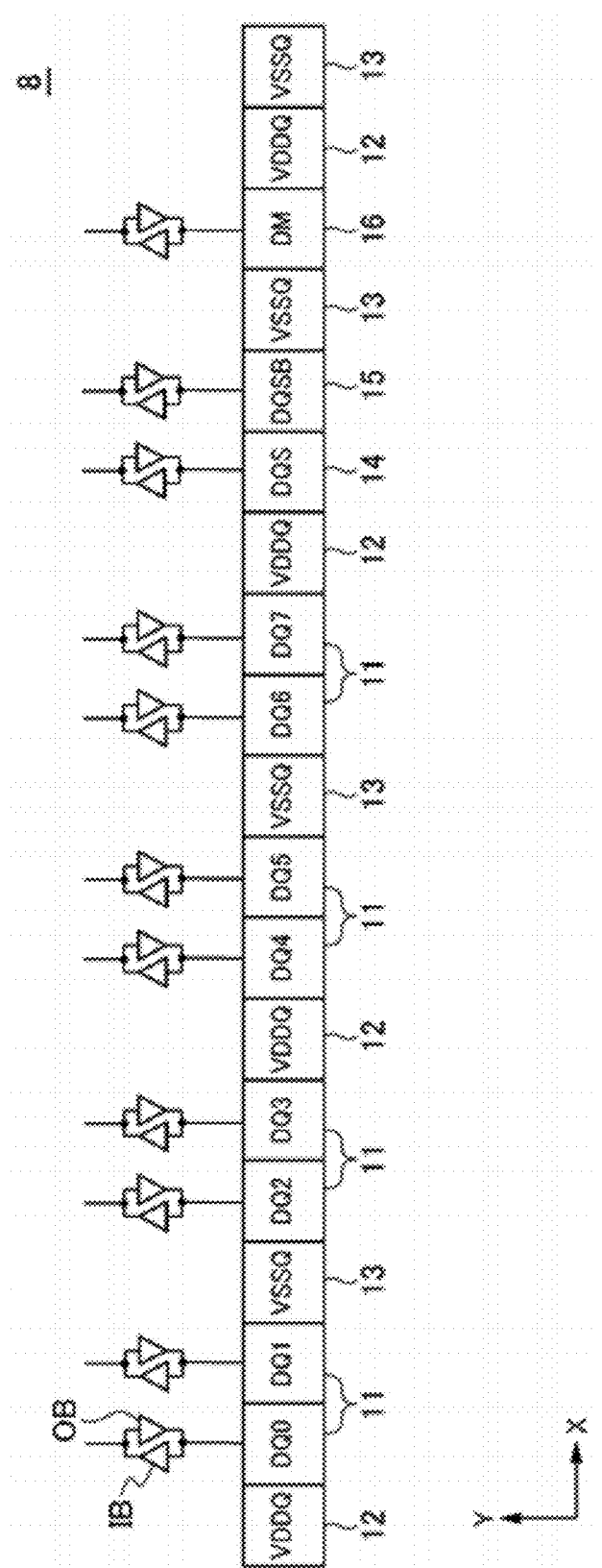
FIG. 3 is an enlarged view of a part of a pad line 8A or 8B.

FIG. 3 is an enlarged view of a part of the pad line 8A or 8B. When distinguishing the pad line 8A from the pad line 8B is not necessary, the pad lines 8A and 8B are collectively referred to as "pad line 8".

The pad line 8 is comprised of multiple pad electrodes arranged in the X direction. FIG. 3 depicts data pads 11, voltage pads 12 and 13, strobe pads 14 and 15, and a data mask pad 16. The data pads 11 are pad electrodes equivalent to the data pads 11A or 11B of FIG. 1. FIG. 3 depicts 8 data pads 11 corresponding to data DQ0 to DQ7, respectively.

The voltage pads 12 and 13 are pad electrodes supplied with source voltages VDDQ and VSSQ, respectively. According to this embodiment, two data pads 11 are sandwiched between the voltage pad 12 and the voltage pad 13. The strobe pads 14 and 15 are pad electrodes corresponding to strobe signal DQS and DQSB, respectively. The data mask pad 16 is a pad electrode corresponding to a data mask signal DM.

As shown in FIG. 3, an output node of a data output buffer OB and an input node of a data input buffer IB are connected to each data pad 11. An input node of the data output buffer OB and an output node of the data input buffer IB are connected to an internal circuit (not depicted). In this configuration, data DQ0 to DQ7 from data output buffers OB are output to the outside of the semiconductor device 10 via data pads 11 corresponding to the data DQ0 to DQ7, respectively. External data DQ0 to DQ7 input to the data pads 11 are supplied to the internal circuit via data input pads 11B. The same data output buffer OB and data input buffer 1B as described above are connected to each of the strobe pads 14 and 15 and the data mask pad 16.

Figure 4:
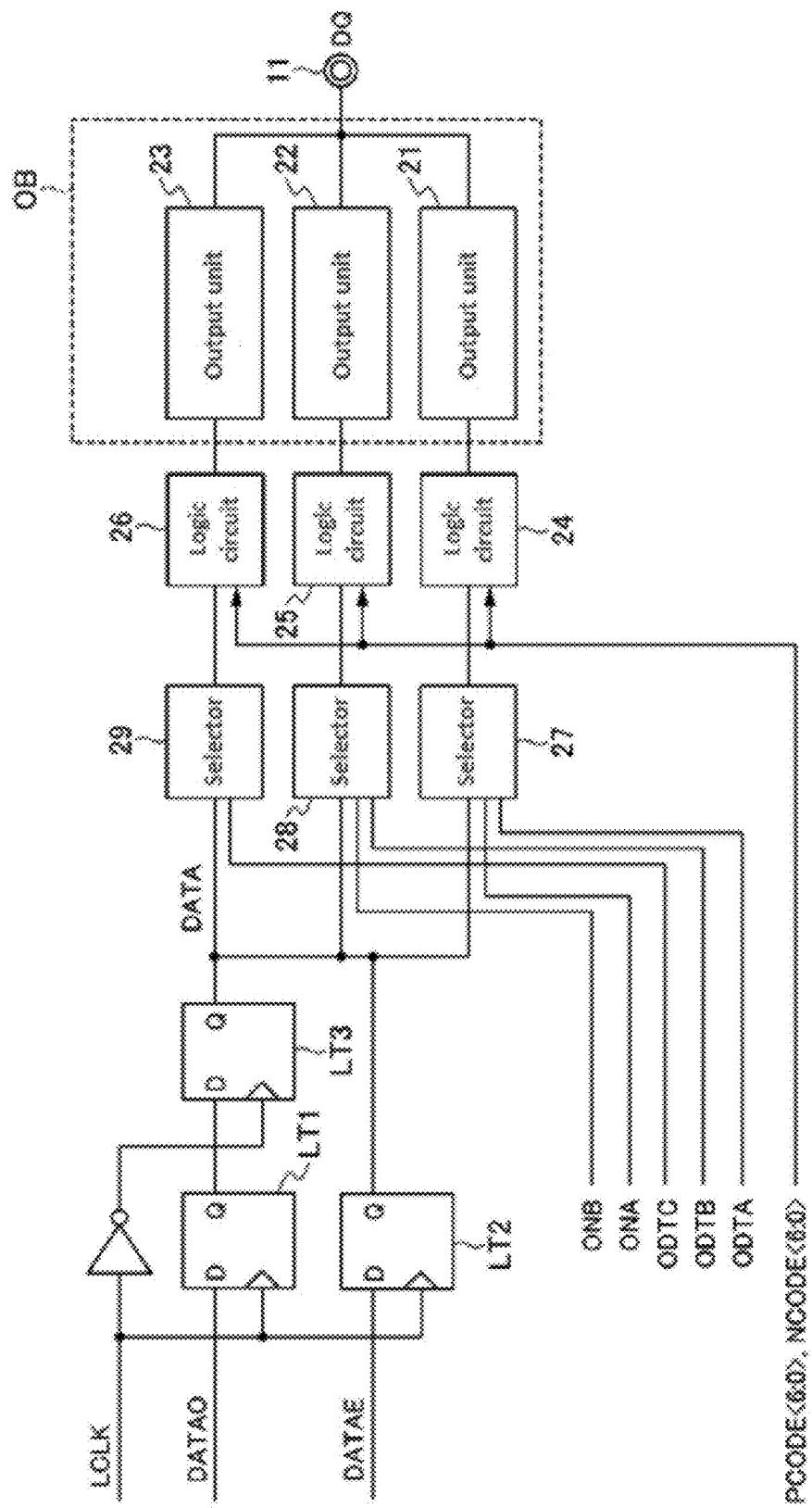
FIG. 4 is a circuit diagram showing a data output buffer OB and circuits around it.

FIG. 4 is a circuit diagram showing the data output buffer OB and circuits around it.

As shown in FIG. 4, the data output buffer OB is configured such that seven output units U are connected in parallel to one data pad 11. A logic circuit 24 and a selector 27 are disposed in a front stage to an output unit 21 comprised of one output unit U. A logic circuit 25 and a selector 28 are disposed in a front stage to an output unit 22 comprised of two output units U. A logic circuit 26 and a selector 29 are disposed in a front stage to an output unit 23 comprised of four output units U.

Internal data DATA is input to every one of the selectors 27 to 29. The internal data DATA is created by converting parallel internal data DATAO and DATAE into serial data through latch circuits LT1 to LT3. The latch circuits LT1 to LT3 operate in synchronization with a phase-controlled internal clock signal LCLK.

The selectors 27 to 29 are circuits that make selections to determine whether or not to activate the output units 21 to 23, respectively. The operations of the selectors 27 to 29 are controlled by selection signal ONA, ONB, ODTA, ODTB, and ODTC. The selection signals ONA and ONB are used to specify activation or non-activation of the output units 21 and 22, respectively, thereby adjust the overall impedance of the data output buffer OB. The selection signals ODTA, ODTB, and ODTC are used when the data output buffer OB is operated as a terminal resistance, that is, when a termination operation is carried out, and are used to specify activation or non-activation of the output units 21 to 23, respectively.

The logic circuits 24 to 26 are circuits that adjust the impedance of groups of output units U included in the output units 21 to 23, respectively. The impedance of the output units U is specified by a pull-up code PCODE and a pull-down code NCODE. In the example of FIG. 4, the pull-up code PCODE is made up of signals PCODE0 to PCODE6 of 7 bits and the pull-down code NCODE is made up of signals NCODE0 to NCODE6 of 7 bits.

Figure 5:
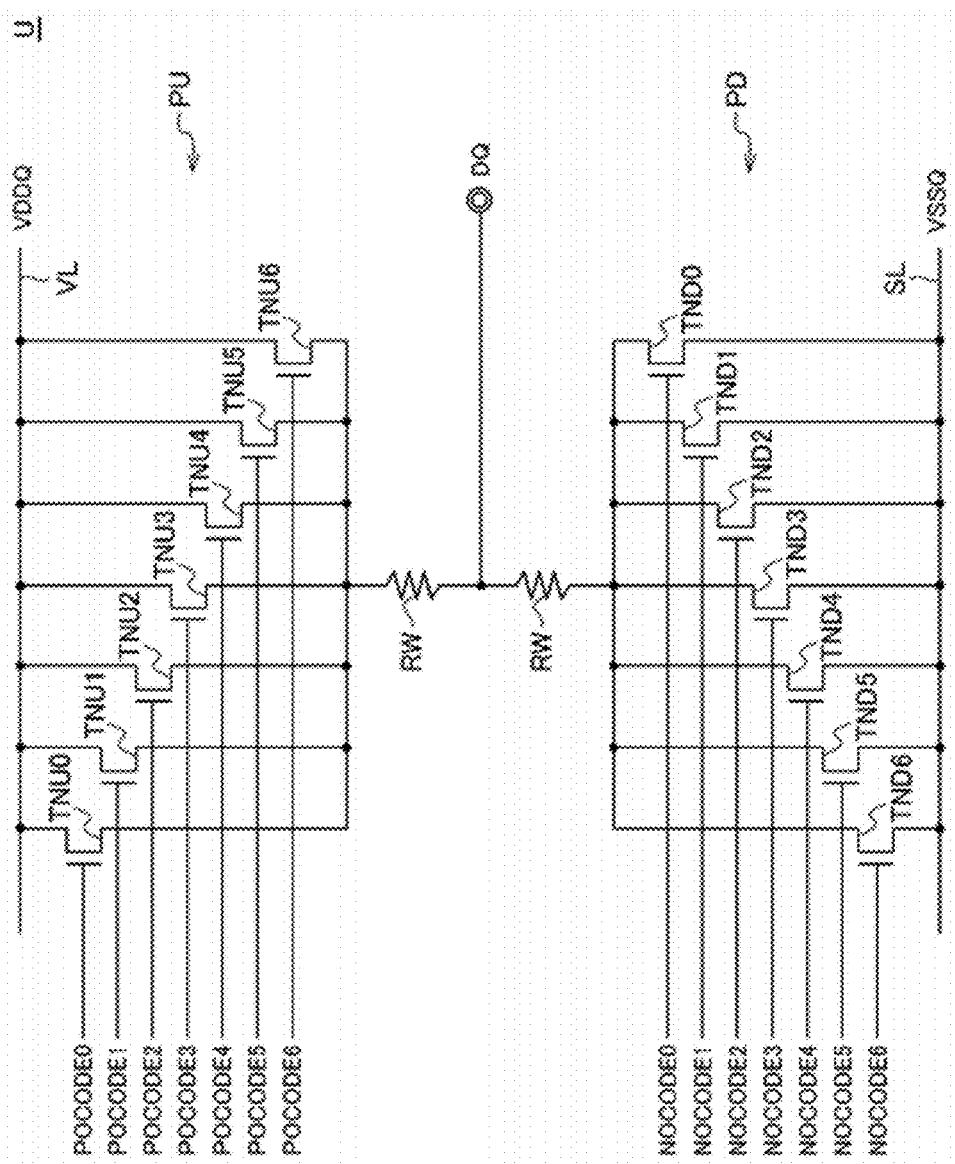
FIG. 5 is a circuit diagram of an output unit U.

FIG. 5 is a circuit diagram of the output unit U.

As shown in FIG. 5, the output unit U is comprised of a pull-up unit PU and a pull-down unit PD. The pull-up unit PU is comprised of a high resistance line RW and a transistor unit TRU consisting of seven parallelly connected n-channel MOS transistors TNU0 to TNU6. The drains of the transistors TNU0 to TNU6 are connected in common to a voltage line VL through which the source voltage VDDQ is supplied, while the sources of the same are connected to the data pad 11 via the high resistance line RW, which is a resistance of, for example, about 40Ω made of tungsten, etc.

The gate electrodes of the transistors TNU0 to TNU6 are supplied with bits POCODE0 to POCODE6 corresponding to the bits PCODE0 to PCODE6 making up the pull-up code PCODE, respectively. As a result, the seven transistors TNU0 to TUN6 are switched on and off separately based on a value for the bit POCODE. The bit POCODE is an output signal based on the pull-up code PCODE and the internal data DATA.

The pull-down unit PD is comprised of a high resistance line RW and a transistor unit TRD consisting of seven parallelly connected n-channel MOS transistors TND0 to TND6. The sources of the transistors TND0 to TND6 are connected in common to a voltage line SL through which the source voltage VSSQ is supplied, while the drains of the same are connected to the data pad 11 via the high resistance line RW, which is a resistance of, for example, about 40Ω made of tungsten, etc.

The gate electrodes of the transistors TND0 to TND6 are supplied with bits NOCODE0 to NOCODE6 corresponding to the bits NCODE0 to NCODE6 making up the pull-down code NCODE, respectively. As a result, the seven transistors TND0 to TUD6 are switched on and off separately based on a value for the bit NOCODE. The bit NOCODE is an output signal based on the pull-down code NCODE and the internal data DATA.

Seven output units U each having such a configuration are provided for one data pad 11. The pull-up units PU included in the seven output units U are collectively laid out in a pull-up circuit region, and are connected to the voltage pad 12 via the voltage line VL. Hereinafter, the pull-up units PU included in the seven output units U are collectively referred to as "pull-up unit P". The pull-down units PD included in the seven output units U are collectively laid out in a pull-down circuit region, and are connected to the voltage pad 13 via the voltage line SL. Hereinafter, the pull-down units PD included in the seven output units U are collectively referred to as "pull-up unit N". The number of the output units U is determined to be 7 in one case. In another case, for example, 15 output units U may be used.

Figure 6:
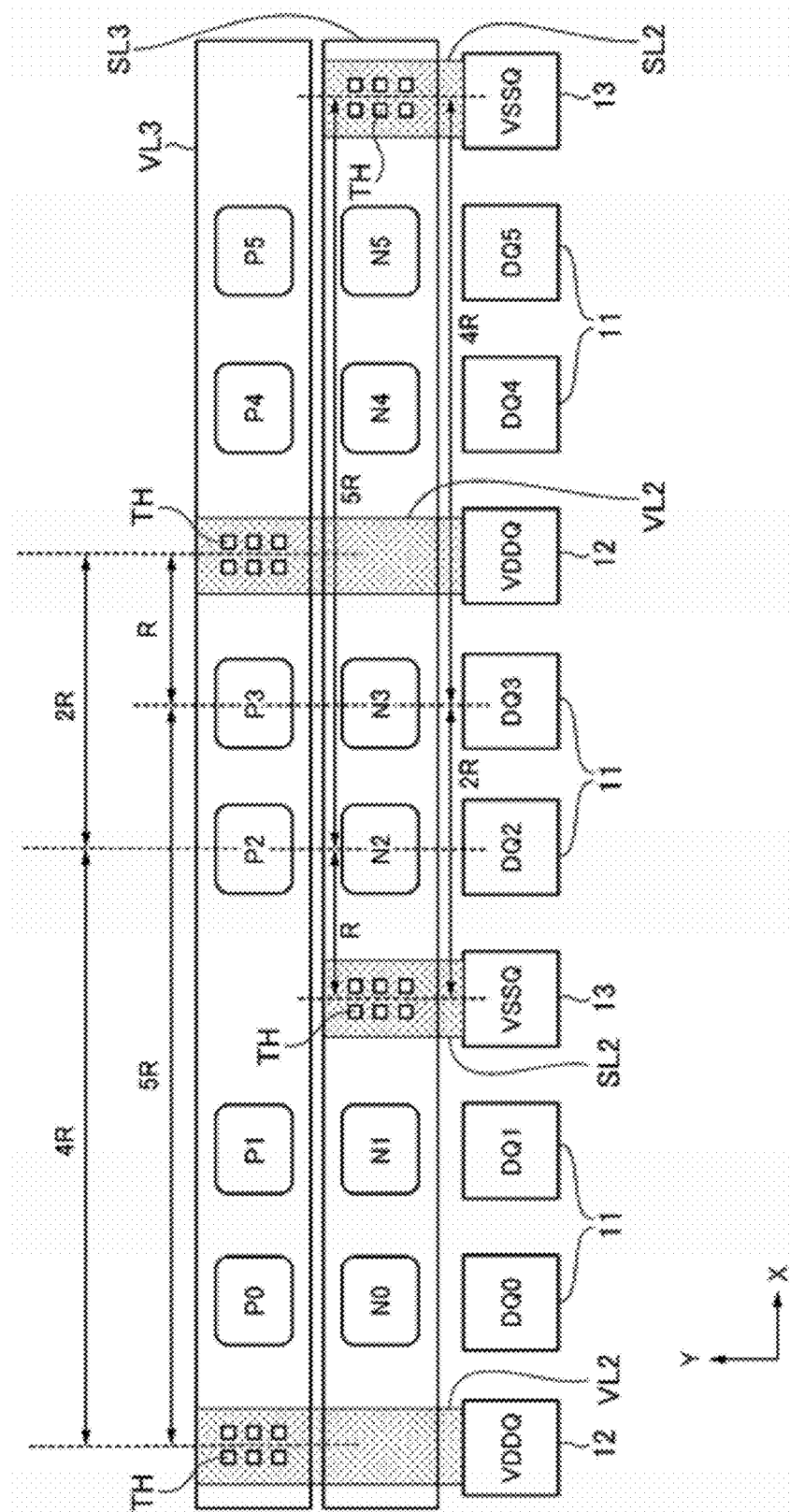
FIG. 6 is a layout of voltage lines VL and SL according to a embodiment that have been examined during the process of completing the present invention.

FIG. 6 is a layout of the voltage lines VL and SL according to an embodiment that have been examined during the process of completing the present invention.

FIG. 6 depicts six data pads 11 corresponding to the data DQ0 to DQ5, respectively, and the voltage pads 12 and 13 arranged adjacent to the data pads 11. In FIG. 6, the pull-up units P corresponding to the data DQ0 to DQ5 are denoted as P0 to P5, and the pull-down units N corresponding to the data DQ0 to DQ5 are denoted as N0 to N5.

According to the embodiment of FIG. 6, a voltage line VL3 extending in the X direction is disposed above the pull-up units P0 to P5, and a voltage line SL3 extending in the X direction is disposed above the pull-down units N0 to N5. The voltage pads 12 are connected to the voltage line VL3 via voltage lines VL2 extending in the Y direction, and the voltage pads 13 are connected to the voltage line SL3 via voltage lines SL2 extending in the Y direction. The voltage lines VL2 and the voltage line VL3 are formed on different wiring layers, respectively, and are interconnected via contact plugs TH on parts where the voltage lines VL2 and the voltage line VL3 overlap. Similarly, the voltage lines SL2 and the voltage line SL3 are formed on different wiring layers, respectively, and are interconnected via contact plugs TH on parts where the voltage lines SL2 and the voltage line SL3 overlap.

The source voltage VDDQ is supplied from the voltage line VL3, which is located above the pull-up units P0 to P5, to the pull-up units P0 to P5 via contact plugs (not depicted). Similarly, the source voltage VSSQ is supplied from the voltage line SL3, which is located above the pull-down units N0 to N5, to the pull-down units N0 to N5 via contact plugs (not depicted).

Figure 7:
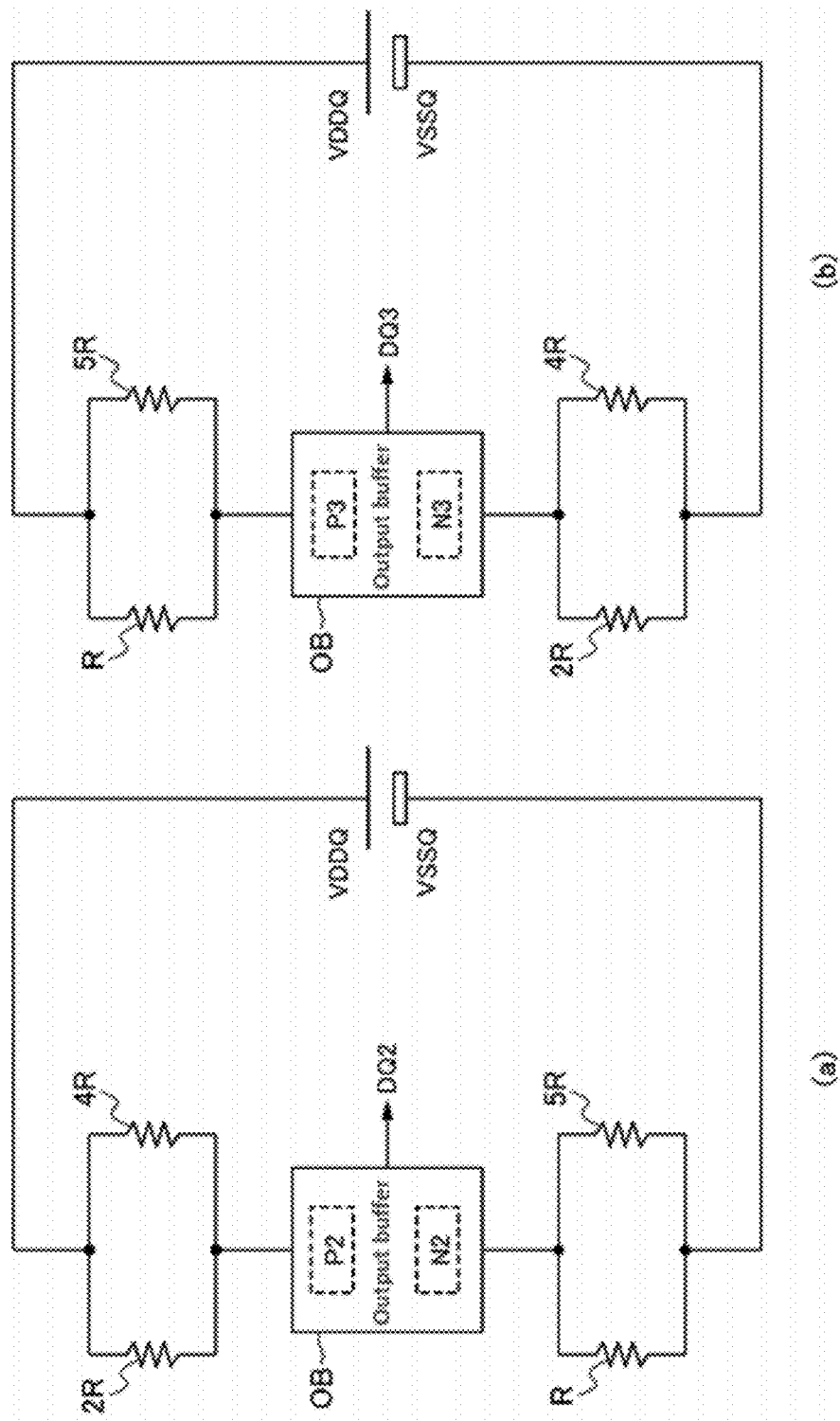
FIG. 7 is a diagram for explaining the line resistance of a power supply path in a case of adopting the layout of the embodiment.

FIG. 7 is a diagram for explaining the line resistance of a power supply path comprised of the voltage lines VL3 and SL3, including FIG. 7(a) showing the line resistance for the output buffer OB corresponding to the data DQ2 and FIG. 7(b) showing the line resistance for the output buffer OB corresponding to the data DQ3.

As shown in FIG. 7(a), it is understood by paying attention to the output buffer OB corresponding to the data DQ2 that the resistance of the voltage line VL3 from which the source voltage VDDQ is supplied to the pull-up unit P2 is equivalent to the combined resistance of a resistance 2R and a resistance 4R. This is because the distance between the pull-up unit P2 and contact plugs TH on the left thereto is different from the distance between the pull-up unit P2 and contact plugs TH on the right thereto, as shown in FIG. 6. Resistance R represents a resistance value corresponding to the distance between adjacent pull-up units P or pull-down units N.

Likewise, the resistance of the voltage line SL3 from which the source voltage VSSQ is supplied to the pull-down unit N2 is equivalent to the combined resistance of a resistance R and a resistance 5R. This is because the distance between the pull-down unit N2 and contact plugs TH on the left thereto is different from the distance between the pull-up unit N2 and contact plugs TH on the right thereto, as shown in FIG. 6.

Hence, for the output buffer OB corresponding to the data DQ2, the combined resistance of the voltage line VL3 is R×4/3 and the combined resistance of the voltage line SL3 is R×5/6.

Meanwhile, as shown in FIG. 7(b), it is understood by paying attention to the output buffer OB corresponding to the data DQ3 that the resistance of the voltage line VL3 from which the source voltage VDDQ is supplied to the pull-up unit P3 is equivalent to the combined resistance of a resistance R and a resistance 5R. Likewise, the resistance of the voltage line SL3 from which the source voltage VSSQ is supplied to the pull-down unit N3 is equivalent to the combined resistance of a resistance 2R and a resistance 4R.

Hence, for the pull-up unit P3, the combined resistance of the voltage line VL3 is R×5/6, which is different from the combined resistance of the voltage line VL3 for the pull-up unit P2. For the pull-down unit N3, the combined resistance of the voltage line SL3 is R×4/3, which is different from the combined resistance of the voltage line SL3 for the pull-down unit N2.

Figure 8:
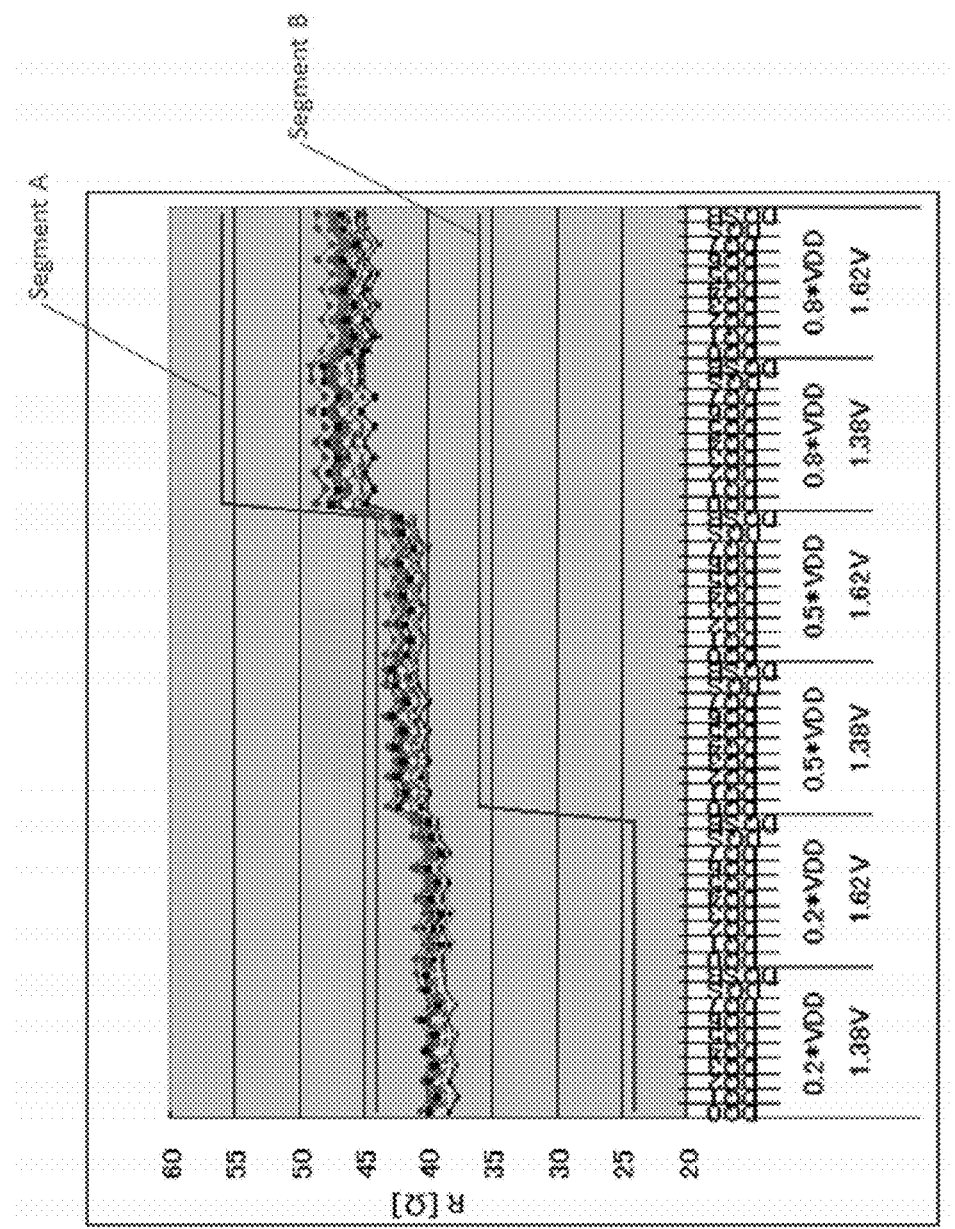
FIG. 8 is a graph showing the impedance of the output buffer OB in the case of adopting the layout of the embodiment.

FIG. 8 is a graph showing the impedance of the output buffer OB in the case of adopting the layout of the embodiment.

In FIG. 8, the vertical axis represents impedance and the horizontal axis represents the output buffers OB corresponding to the data DQ0 to DQ7 and data strobe signals DQS and DQSB, which output buffers OB are plotted for respective source voltage conditions. Along the horizontal axis, "0.2× VDDQ", "0.5×VDDQ", and "0.8×VDDQ" represent reference voltage levels and "1.38 V" and "1.62 V" represent the voltage levels of the source voltage VDDQ. A segment A represents a specified impedance upper limit and a segment B represents a specified impedance lower limit.

As shown in FIG. 8, according to the layout of the embodiment, the impedances of adjacent output buffers OB are different from each other under every source voltage condition. Specifically, the output buffers OB corresponding to the even data DQ0, DQ2, DQ4, and DQ6 have high impedances, while the output buffers OB corresponding to the odd data DQ1, DQ3, DQ5, and DQ7 have low impedances. A zigzagged impedance curve thus results on a graph of FIG. 8.

Such variation in the impedances of respective output buffers OB leads to a reduction in an impedance margin. It is therefore desirable that impedance characteristics be kept flat as much as possible. In layouts according to several embodiments to be described below, such impedance variation is suppressed to offer flatter impedance characteristics.

Figure 9:
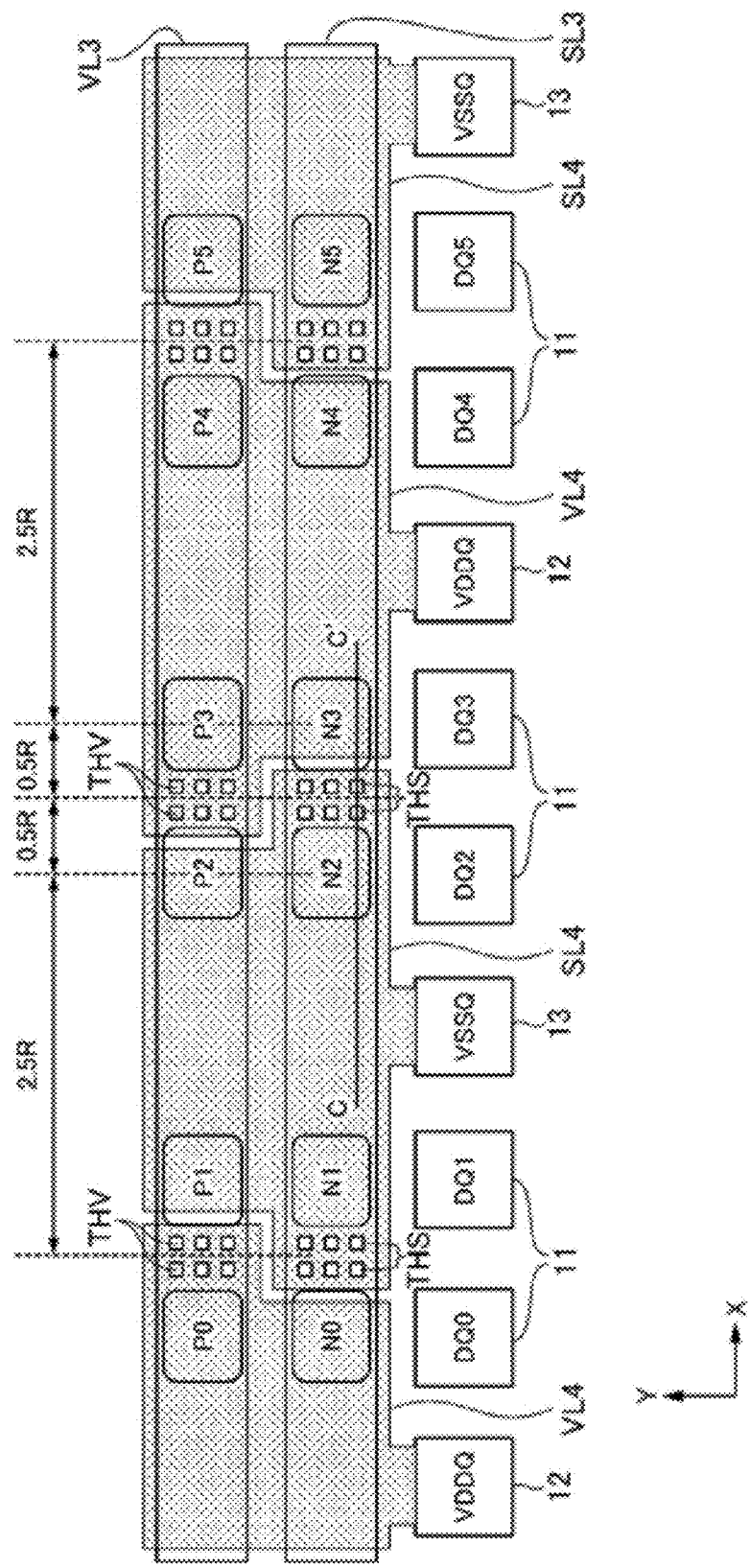
FIG. 9 is a layout of the voltage lines VL and SL according to a first embodiment of the present invention.
Figure 10:
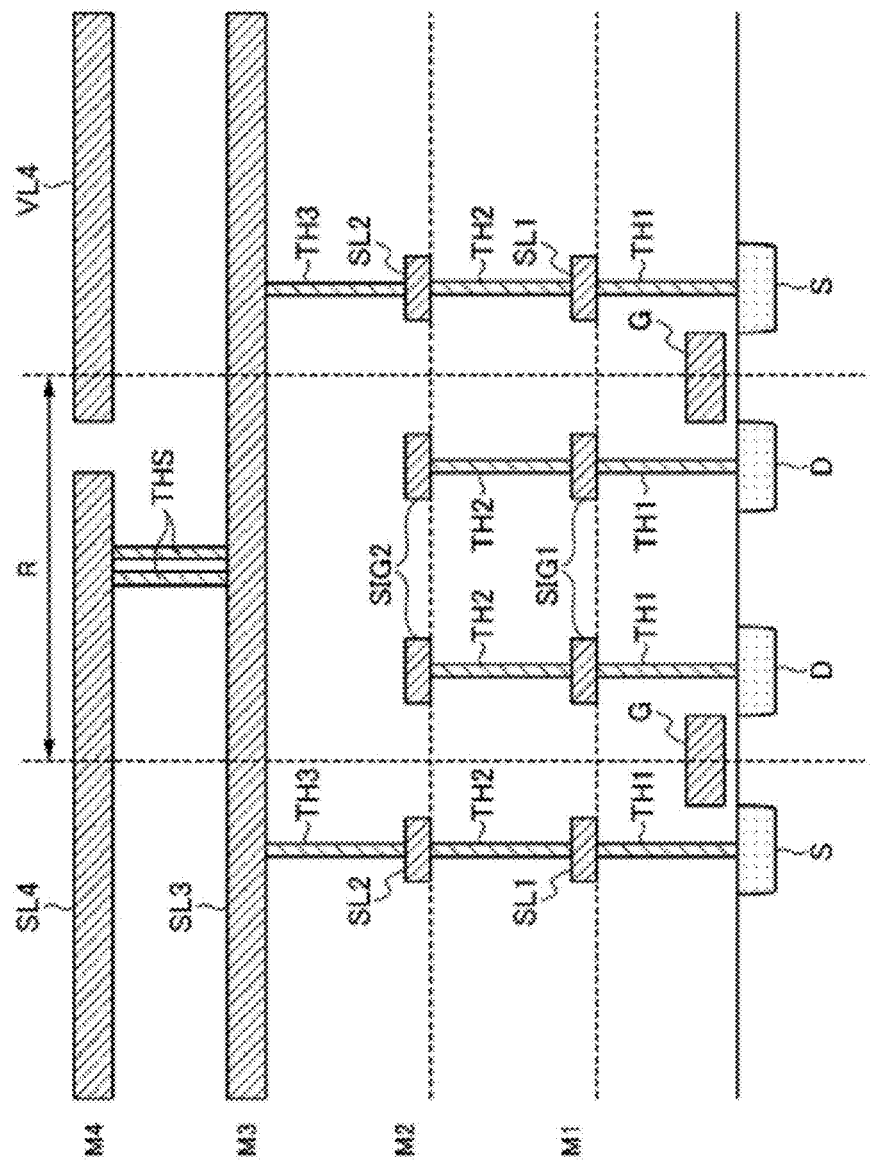
FIG. 10 is a sectional view taken along a C-C' line of FIG. 9.

FIG. 9 is a layout of the voltage lines VL and SL according to a first embodiment of the present invention, and FIG. 10 is a sectional view taken along a C-C' line of FIG. 9.

FIG. 9 depicts six data pads 11 corresponding to the data DQ0 to DQ5, respectively, and the voltage pads 12 and 13 arranged adjacent to these data pads 11. In the same manner as in FIG. 6, the pull-up units P corresponding to the data DQ0 to DQ5 are denoted as P0 to P5, and the pull-down units N corresponding to the data DQ0 to DQ5 are denoted as N0 to N5.

As shown in FIG. 9, according to the layout of the first embodiment, the voltage line VL3 extending in the X direction is disposed above the pull-up units P0 to P5, and the voltage line SL3 extending in the X direction is disposed above the pull-down units N0 to N5. The voltage pads 12 are connected to the voltage line VL3 via voltage lines VL4, and the voltage pads 13 are connected to the voltage line SL3 via voltage lines SL4. As shown in FIG. 10, the voltage lines VL4 and SL4 are formed on a fourth wiring layer M4, and the voltage lines VL3 and SL3 are formed on a third wiring layer M3.

The fourth wiring layer M4 is the uppermost wiring layer, and is used to form the data pads 11 as well as the voltage pads 12 and 13. The source voltage VDDQ supplied to the voltage pads 12 is, therefore, supplied directly to the voltage lines VL4 formed on the fourth wiring layer M4 without intervention of contact plugs TH. Similarly, the source voltage VSSQ supplied to the voltage pads 13 is supplied directly to the voltage lines SL4 formed on the fourth wiring layer M4 without intervention of contact plugs TH.

The voltage lines VL4 are connected to the voltage line VL3 via multiple contact plugs THV. Each group of contact plugs THV is located on an end in the X direction of the voltage line VL4 such that the contact plugs THV are placed between two pull-up units P (e.g., P2 and P3) corresponding to two data pads 11 adjacent to each other. On the voltage line VL3, therefore, the length of a portion connecting the contact plugs THV to one pull-up unit P (e.g., P2) (distance between the contact plugs THV and one pull-up unit P) is equal to the length of a portion connecting the contact plugs THV to the other pull-up unit P (e.g., P3) (distance between the contact plugs THV and the other pull-up unit P).

In the same manner, the voltage lines SL4 are connected to the voltage line SL3 via multiple contact plugs THS. Each group of contact plugs THS is located on an end in the X direction of the voltage line SL4 such that the contact plugs THS are placed between two pull-down units N (e.g., N2 and N3) corresponding to two data pads 11 adjacent to each other. On the voltage line SL3, therefore, the length of a portion connecting the contact plugs THS to one pull-down unit N (e.g., N2) (distance between the contact plugs THS and one pull-down unit N) is equal to the length of a portion connecting the contact plugs THS to the other pull-down unit N (e.g., N3) (distance between the contact plugs THS and the other pull-up unit N). Two data pads 11 adjacent to each other means two data pads 11 sandwiched between the voltage pad 12 and the voltage pad 13.

As shown in FIG. 9, the contact plugs THV and THS are arranged in the Y direction. The voltage lines VL4 and the voltage lines SL4 adjacent to each other are separated from each other via crank-shaped slits formed on the fourth wiring layer M4. Above the voltage line VL3, such a slit is formed between the pull-up unit P2 and the contact plugs THV in a plan view. Above the voltage line SL3, such a slit is formed between the pull-down unit N3 and the contact plugs THS in a plan view, and is also formed between the contact plugs THV and the contact plugs THS. In this manner, in a view from the contact plugs THV, the voltage line VL4 is separated from the voltage line SL4 on one side (left side) in the X direction, and in a view from the contact plugs THS, the voltage line VL4 is separated from the voltage line SL4 on the other side (right side) in the X direction.

According to this embodiment, all pull-up units P and pull-down units N are at least partially covered with the voltage lines VL4 or SL4. For example, the pull-up unit P3 is covered with the voltage line VL4 while the pull-down unit N2 is covered with the voltage line SL4. The pull-down unit N3 is partially covered with the voltage line VL4 while the pull-up unit P2 is partially covered with the voltage line SL4.

As shown in FIG. 10, the voltage line SL3 on the third wiring layer M3 is connected to a voltage line SL2 on a second layer M2 via contact plugs TH3. The voltage line SL2 on the second wiring layer M2 is connected to a voltage line SL1 on a first layer M1 via contact plugs TH2. The voltage line SL1 on the first layer M1 is then connected to the sources S of the transistors TND making up the pull-down unit N. The drains D of the transistors TND making up the pull-down unit N are connected to the corresponding data pad 11 via contact plugs TH1, a signal line SIG1, contact plug TH2, a signal line SIG2, etc. To the gate electrodes G of the transistors, the corresponding bits of the pull-down code NCODE are input, respectively.

The transistors TNU making up the pull-up unit P have the same configuration as that of the transistors TND described above.

In the above configuration, for example, both of the pull-up units P2 and P3 corresponding respectively to the data DQ2 and DQ3 are supplied with the source voltage VDDQ from the contact plugs THV located between the pull-up units P2 and P3, with the source voltage VDDQ from the contact plugs THV located between the pull-up units P0 and P1 corresponding respectively to the data DQ0 and DQ1, and with the source voltage VDDQ from the contact plugs THV located between the pull-up units P4 and P5 corresponding respectively to the data DQ4 and DQ5. Similarly, both of the pull-down units N2 and N3 are supplied with the source voltage VSSQ from the contact plugs THS located between the pull-down units N2 and N3, with the source voltage VSSQ from the contact plugs THS located between the pull-up units N4 and N5, and with the source voltage VSSQ from the contact plugs THS located between the pull-up units N0 and N1.

Figure 11:
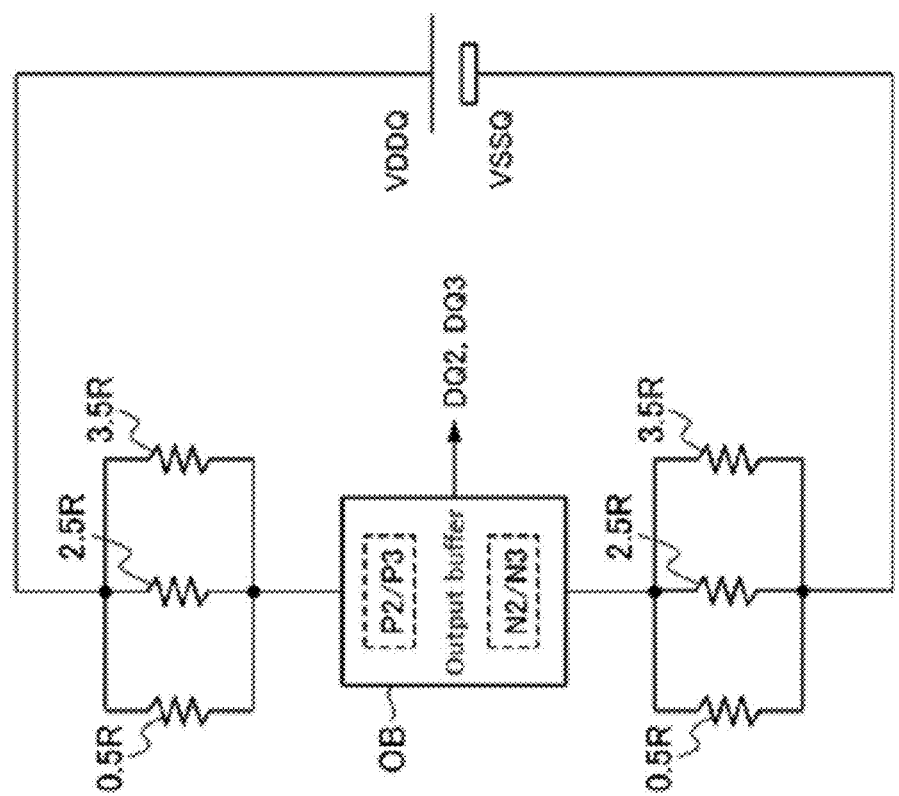
FIG. 11 is a diagram for explaining the line resistance of the power supply path according to the first embodiment.

FIG. 11 is a diagram for explaining the line resistance of a power supply path comprised of the voltage lines VL3 and SL3, showing the line resistance for the output buffer OB corresponding to the data DQ2 and DQ3.

As shown in FIG. 11, according to this embodiment, the resistance of the voltage line VL3 through which the source voltage VDDQ is supplied to the pull-up units P2 and P3 is the combined resistance of a resistance 0.5R, a resistance 2.5R, and a resistance 3.5R that are connected in parallel. This is because that as shown in FIG. 9, contact plugs THV are formed in a location separated away from the pull-up unit P2 or P3 by 0.5 arrangement pitch of the pull-up unit P, a location separated away from the same by 2.5 arrangement pitch of the pull-up unit P, and a location separated away from the same by 3.5 arrangement pitch of the pull-up unit P.

Likewise, the resistance of the voltage line SL3 through which the source voltage VSSQ is supplied to the pull-up units N2 and N3 is the combined resistance of a resistance 0.5R, a resistance 2.5R, and a resistance 3.5R that are connected in parallel. This is because that as shown in FIG. 9, contact plugs THS are formed in a location separated away from the pull-down unit N2 or N3 by 0.5 arrangement pitch of the pull-down unit N, a location separated away from the same by 2.5 arrangement pitch of the pull-down unit N, and a location separated away from the same by 3.5 arrangement pitch of the pull-down unit N.

In this manner, according to this embodiment, for two pull-up units P adjacent to each other, the resistances of the power supply paths each comprised of the voltage line VL3 are almost the same. Similarly, for two pull-down units N adjacent to each other, the resistances of the power supply paths each comprised of the voltage line SL3 are almost the same. This offers impedance characteristics flatter than impedance characteristics in the case of adopting the layout of the embodiment.

In addition, according to this embodiment, the resistance of the voltage line VL3 connected to the pull-up unit P and the resistance of the voltage line SL3 connected to the pull-down unit N are also almost the same. Furthermore, the actual combined resistance can be kept lower than the actual combined resistance in the case of adopting the layout of the embodiment.

Figure 12:
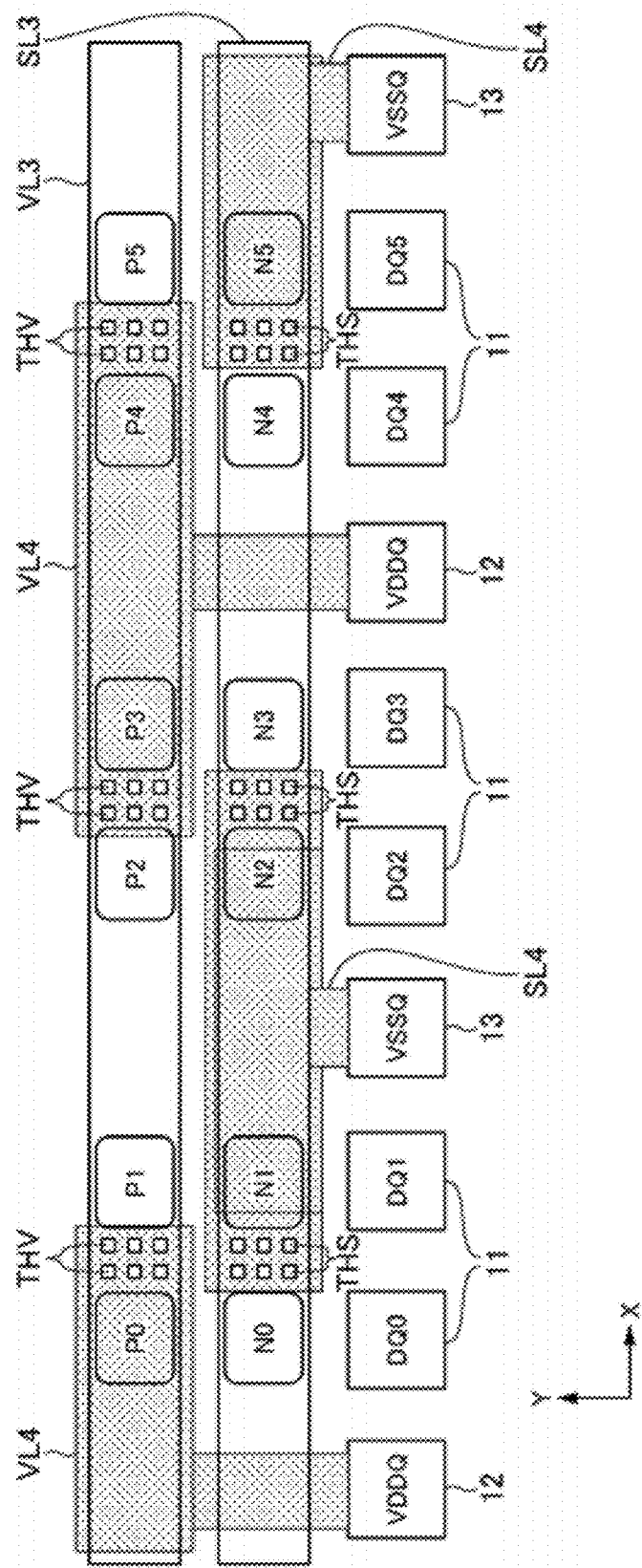
FIG. 12 is a layout of the voltage lines VL and SL according to a modification of the first embodiment of the present invention.

In the layout of FIG. 9, the voltage lines VL4 are broadened in the X direction to widely cover an area above the voltage line SL3, and the voltage lines SL4 are also broadened in the X direction to widely cover an area above the voltage line VL3. This configuration, however, is not essential. As shown in FIG. 12, the voltage lines VL4 and SL4 may be narrowed or eliminated in the X direction in the areas above the voltage lines SL3 and VL3. It is nevertheless the fact that forming the above broadened portions of the voltage lines VL4 and SL4, as shown in the layout of FIG. 9, reduces the voltage line resistance and increases the voltage source capacity.

Figure 13:
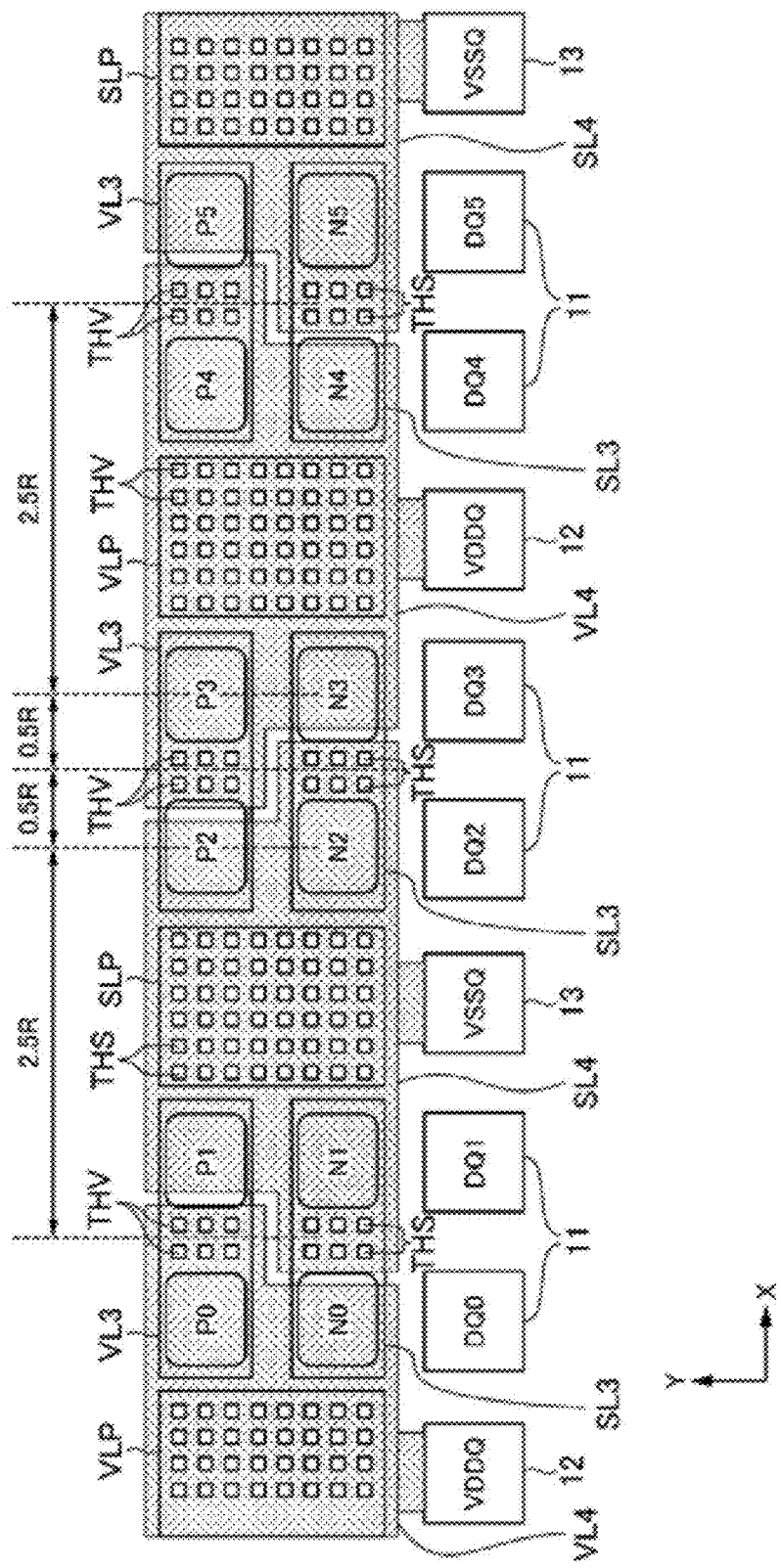
FIG. 13 is a layout of the voltage lines VL and SL according to a second embodiment of the present invention.

FIG. 13 is a layout of the voltage lines VL and SL according to a second embodiment of the present invention.

As shown in FIG. 13, the layout of the second embodiment is different from the layout of the first embodiment of FIG. 9 in that the voltage lines VL3 and SL3 are segmented in the X direction. For example, the segmented voltage line VL3 connected to the pull-up units P2 and P3 is connected to the voltage line VL4 via contact plugs THV without being connected to a different line on the third wiring layer M3. Likewise, the segmented voltage line SL3 connected to the pull-down units N2 and N3 is connected to the voltage line SL4 via contact plugs THS without being connected to a different line on the third wiring layer M3.

Between groups of segmented voltage lines VL3 and SL3 arranged in the X direction, a pad line VLP or SLP is disposed on the third wiring layer M3 and is connected to the voltage line VL4 or SL4 via contact plugs THV or RHS. In other aspects, the layout of the second embodiment is the same as the layout of the first embodiment, and therefore the same constituent elements as described in the first embodiment are denoted by the same reference numerals and redundant description is omitted.

In this manner, according to this embodiment, the segmented voltage line VL3 is used exclusively for a pair of pull-up units P (e.g., P2 and P3) and the segmented voltage line SL3 is used exclusively for a pair of pull-down units N (e.g., N2 and N3). As a result, the resistance of the voltage line VL3 is the same for every pull-up unit P, and the resistance of the voltage line SL3 is the same for every pull-down unit N.

Figure 14:
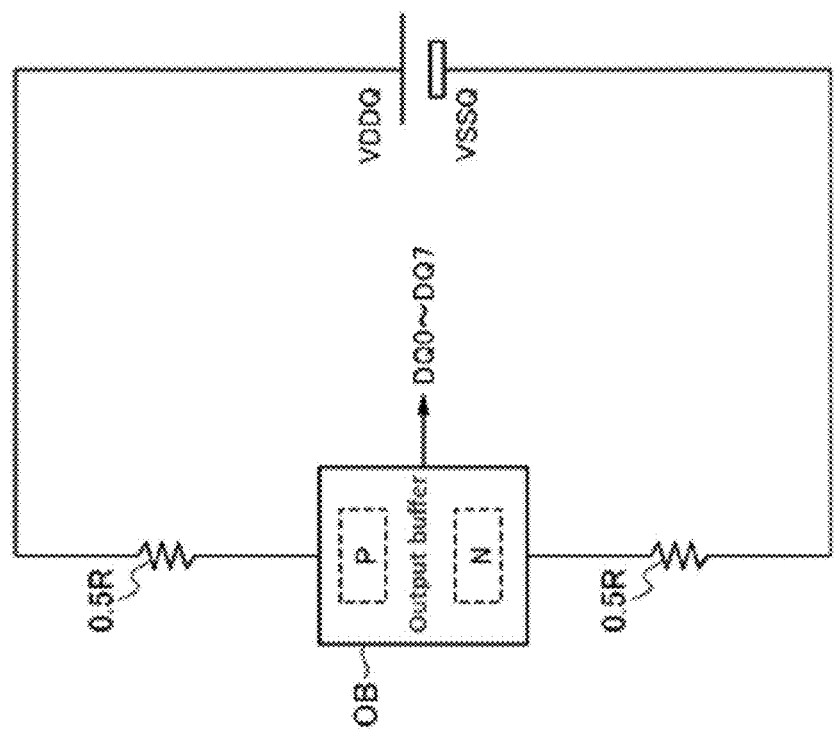
FIG. 14 is a diagram for explaining the line resistance of the power supply path according to the second embodiment.

FIG. 14 is a diagram for explaining the line resistance of the power supply paths comprised of the voltage lines VL3 and SL3, showing the line resistance for the output buffers OB corresponding to all data DQ0 to DQ7.

As shown in FIG. 14, according to this embodiment, the resistance of each segmented voltage line VL3 through which the source voltage VDDQ is supplied to the pull-up unit P is a resistance 0.5R, and the resistance of each segmented voltage line SL3 through which the source voltage VSSQ is supplied to the pull-down unit N is a resistance 0.5R. As a result, the output buffers OB corresponding to the data DQ0 to DQ7 are put under the same source voltage condition, in which case flatter impedance characteristics can be achieved.

In this embodiment, providing the pad line VLP or SLP is not essential. However, the voltage line resistance can be reduced by providing the pad line VLP or SLP.

Figure 15:
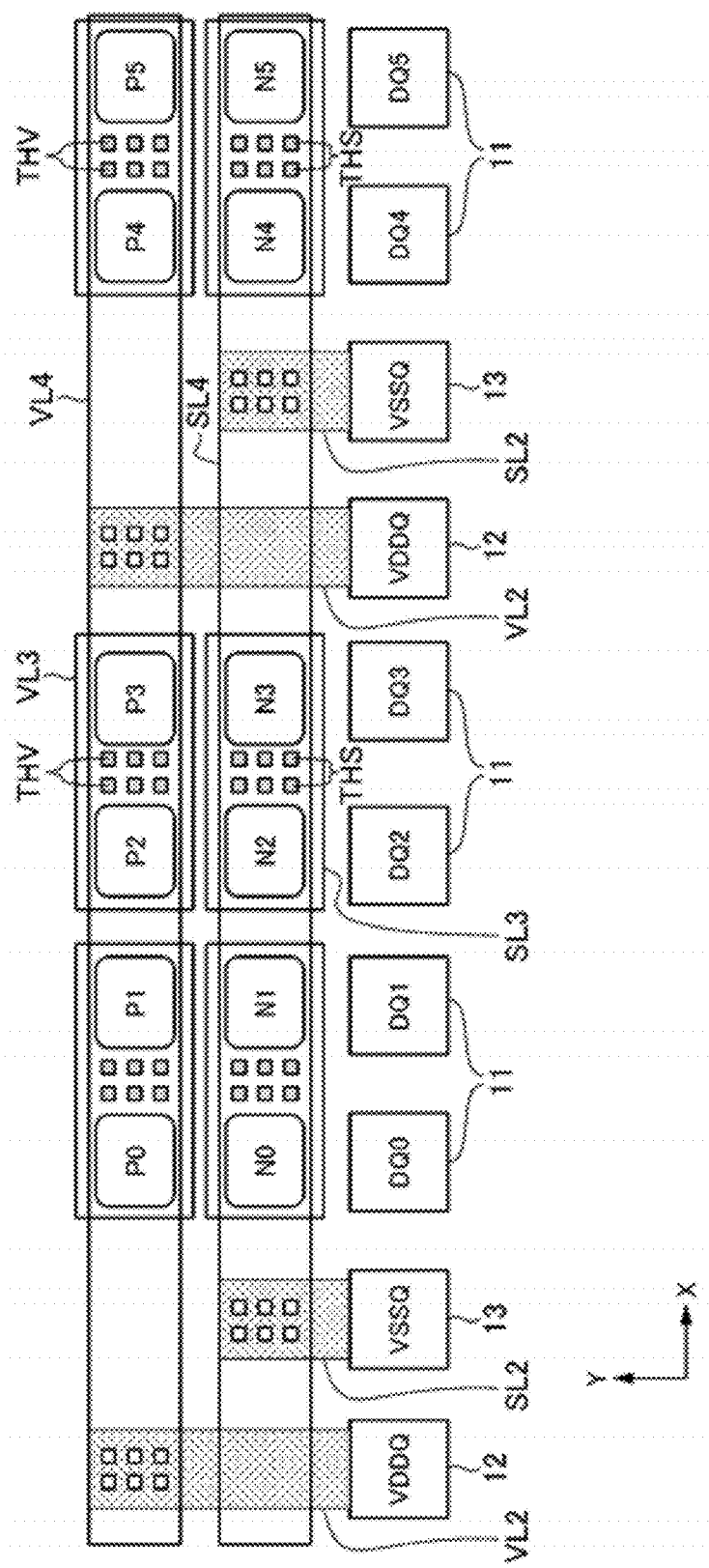
FIG. 15 is a layout of the voltage lines VL and SL according to a third embodiment of the present invention.

FIG. 15 is a layout of the voltage lines VL and SL according to a third embodiment of the present invention.

As shown in FIG. 15, according to the layout of the third embodiment, the voltage pads 12 are connected to the voltage line VL4 via voltage lines VL2 formed on the second wiring layer M2, and the voltage pads 13 are connected to the voltage line SL4 via voltage lines SL2 formed on the second wiring layer M2. As a result, the pad lines VLP and SLP are eliminated. In other aspects, the layout of the third embodiment is the same as the layout of the first embodiment, and therefore the same constituent elements as described the first embodiment are denoted by the same reference numerals and redundant description is omitted.

According to this embodiment, in the same manner as in the second embodiment, the resistance of the voltage line VL3 is the same for every pull-up unit P, and the resistance of the voltage line SL3 is the same for every pull-down unit N. The layout of the third embodiment is effective for a case where voltage lines cannot be extended directly from the voltage pads 12 and 13 by using the fourth wiring layer M4.

Figure 16:
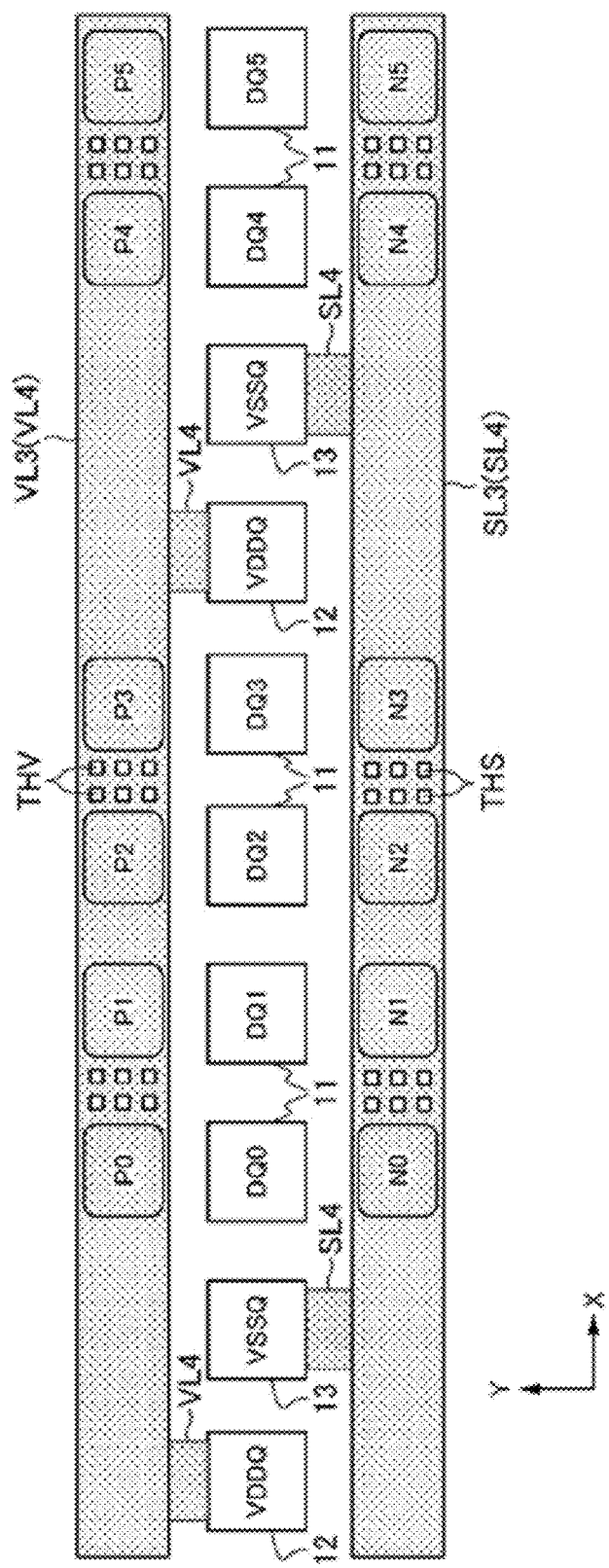
FIG. 16 is a layout of the voltage lines VL and SL according to a fourth embodiment of the present invention.

FIG. 16 is a layout of the voltage lines VL and SL according to a fourth embodiment of the present invention.

As shown in FIG. 16, according to the layout of the fourth embodiment, the pull-up units P are arranged on one side in the Y direction relative to the data pads 11, while the pull-down units N are arranged on the other side in the Y direction relative to the data pads 11. In other words, the data pads 11 are sandwiched between the pull-up units P and the pull-down units N.

The voltage pads 12 are connected to the voltage line VL4 formed on the fourth wiring layer M4 and are also connected to the voltage line VL3 formed on the third wiring layer M3 via contact plugs THV. The voltage lines VL3 and VL4 are so located that the voltage line VL4 is superposed on the voltage line VL3 in a plan view. Contact plugs THV are formed between each pair of pull-up units P (e.g., P2 and P3) in the same manner as in the first to third embodiments.

Likewise, the voltage pads 13 are connected to the voltage line SL4 formed on the fourth wiring layer M4 and are also connected to the voltage line SL3 formed on the third wiring layer M3 via contact plugs THS. The voltage lines SL3 and SL4 are so located that the voltage line SL4 is superposed on the voltage line SL3 in a plan view. Contact plugs THS are formed between each pair of pull-up units N (e.g., N2 and N3) in the same manner as in the first to third embodiments.

In this manner, in the case of the configuration in which the data pads 11 are sandwiched between the pull-up units P and the pull-down units N, by adopting the layout of FIG. 16, the impedance characteristics of paired pull-up units P (e.g., P2 and P3) and paired pull-up units N (e.g., N2 and N3) can be made identical.

Figure 17:
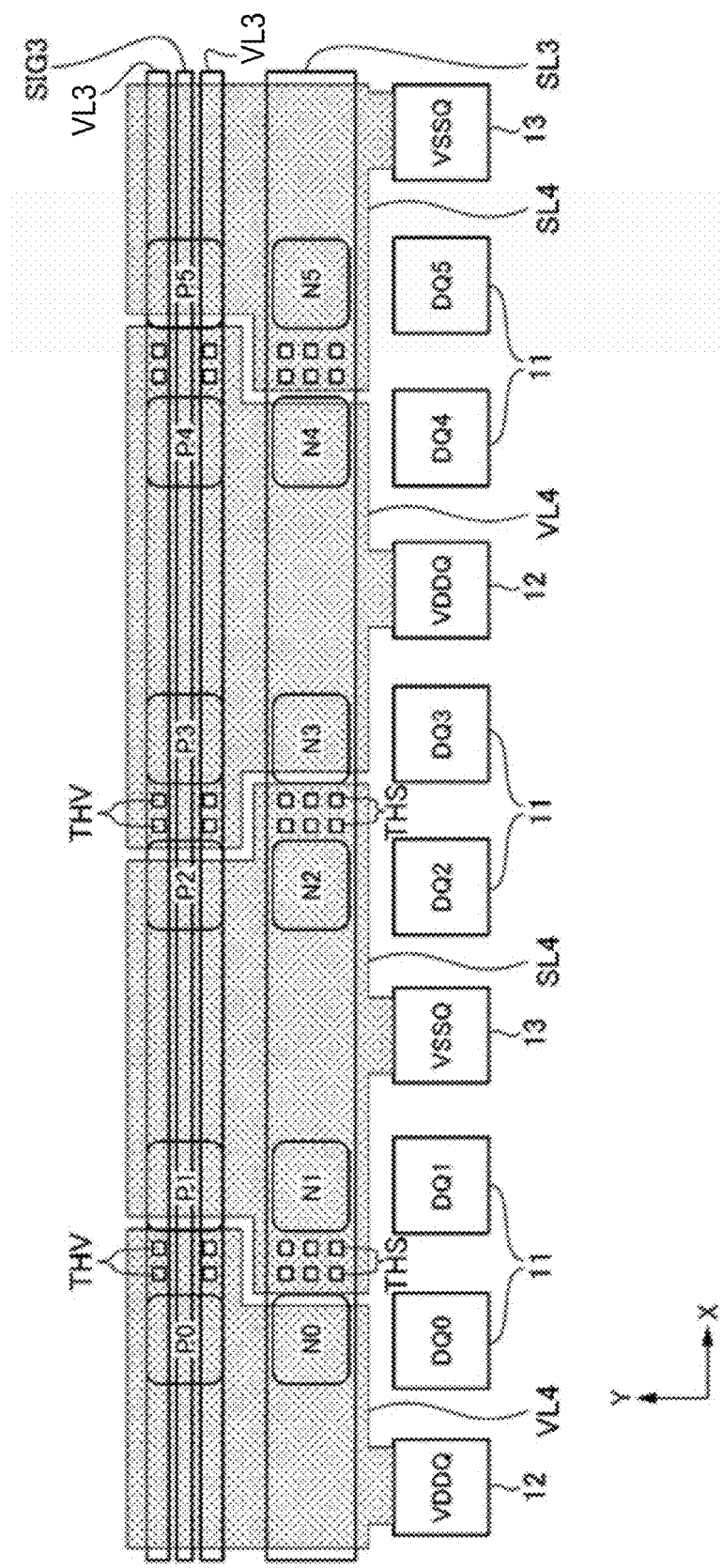
FIG. 17 is a layout of the voltage lines VL and SL according to a fifth embodiment of the present invention.

FIG. 17 is a layout of the voltage lines VL and SL according to a fifth embodiment of the present invention. In the layout of the first embodiment of FIG. 9, the voltage line VL3 is provided as a single thick line. According to the fifth embodiment, however, the voltage line VL3 is divided into multiple thin lines between which a signal line SIG3 extends in the X direction. The signal line SIG3 is, for example, a signal line connected to the gates of transistors making up the pull-up unit P. FIG. 17 depicts an example in which the voltage line VL3 is divided into two lines. However, the voltage line SL3 may be divided into two or more lines. This embodiment allows a more flexible line layout. The configuration of the voltage lines VL3 and SL3 and signal line SIG3 according to this embodiment apply also to the second to fourth embodiments and to a sixth embodiment, which will be described below.

Figure 18:
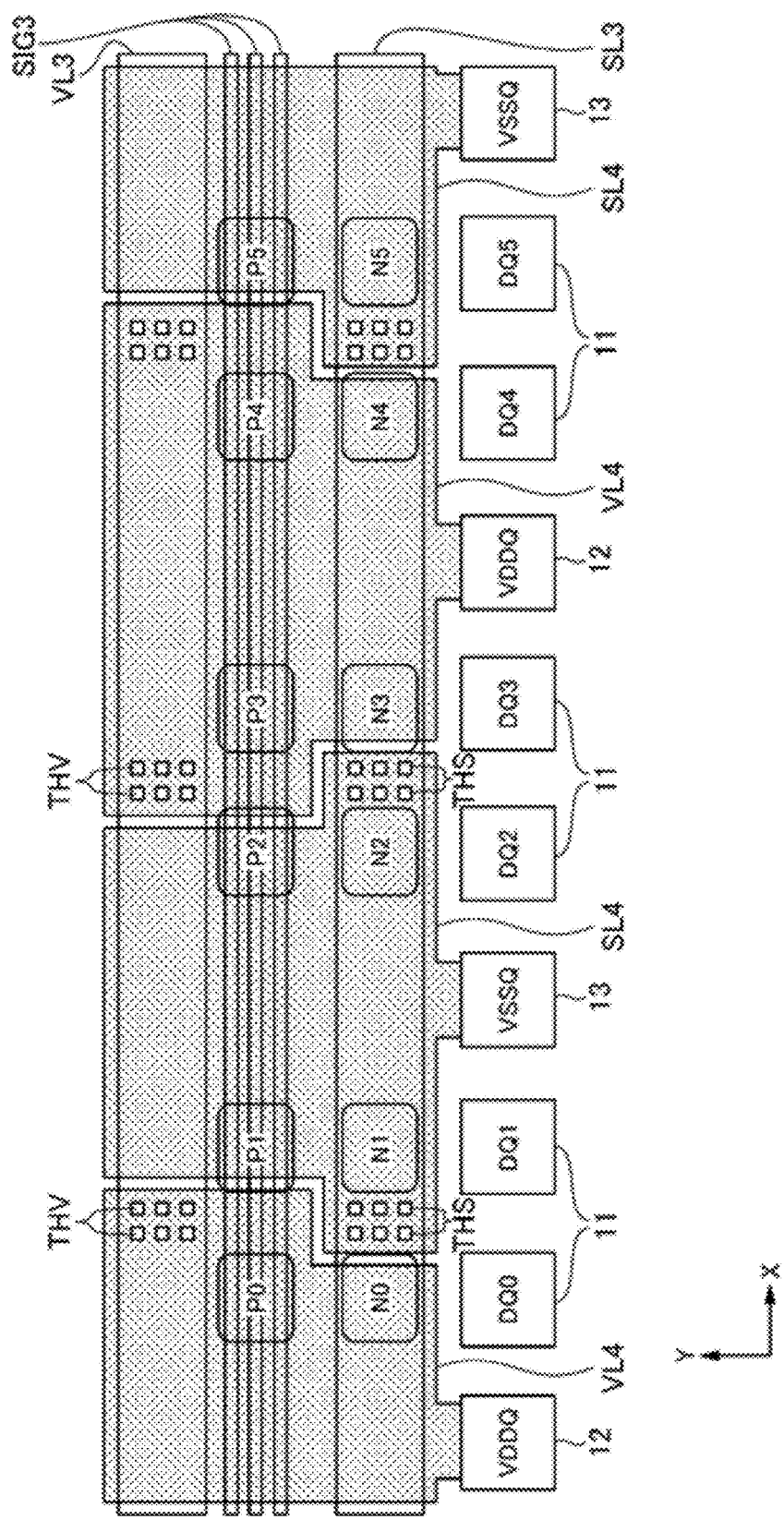
FIG. 18 is a layout of the voltage lines VL and SL according to a sixth embodiment of the present invention.

FIG. 18 is a layout of the voltage lines VL and SL according to the sixth embodiment of the present invention. In the layout of the first embodiment of FIG. 9, the voltage lines VL3 and SL3 extend right above the pull-up units P and pull-down units N. According to the sixth embodiment, however, the voltage line VL3 extends in a location shifted from the location right above the pull-up units P, and each pull-up unit P is supplied with a source voltage via the voltage line VL2 formed on the wiring layer M2 shown in FIG. 10. FIG. 18 depicts an example in which the location of the voltage line VL3 is shifted. However, the location of the voltage line SL3 may be shifted. This embodiment allows a greater number of signal lines SIG3 to be arranged right above the pull-up units P or pull-down units N. In such a configuration, impedances between paired pull-up (pull-down) units can be made identical, and a layout of the voltage lines can be designed flexibly as their relationship with other signal lines is taken into consideration.

The preferred embodiments of the present invention have been described above. The present invention is not limited to the above embodiments but may be modified into various forms of applications on the condition that the modification does not deviate from the substance of the invention. It is obvious that modified forms of applications are also included in the scope of the present invention.

For example, the above embodiments have been described as examples of applying the present invention to a DRAM. Obviously, the present invention is not limited to such example. The features of the present invention may be applied to the output buffers 5A and 5B included in the controller 2 of FIG. 1. The present invention may also be applied to a semiconductor device other than the DRAM, such as flash memory, SRAM, ReRAM, and MTAM (STT-RAM).

I claim:

1. An apparatus comprising:
   first and second data pads arranged adjacently to each other without an intervention of any other pad between the first and second data pads;
   first and second output transistors coupled correspondingly to the first and second data pads and arranged adjacently to each other;
   at least one contact plug between the first and second output transistors to supply a voltage to each of the first and second output transistors;
   a voltage pad arranged adjacently to the first data pad and supplied with the voltage;
   wherein the voltage pad is defined as a first voltage pad, the voltage is defined as a first voltage and the at least one contact plug is defined as at least one first contact plug;
   third and fourth output transistors coupled correspondingly to the first and second data pads and arranged adjacently to each other;
   a second voltage pad arranged adjacently to the second data pad and supplied with a second voltage;
   at least one second contact plug through which the second voltage is supplied to each of the third and fourth output transistors is arranged between the third and fourth transistors; and
   wherein each of the first, second, third and fourth transistors is an N-type transistor; and
   wherein the at least one first contact plug and the first and second output transistors are not in line with one another;
   wherein at least one signal line passes directly over the first and second output transistors and is coupled with gates of the first and second output transistors; and
   wherein the at least one first contact plug is shifted from in line with the first and second output transistors by a sufficient distance to provide room for the at least one signal line to pass directly over the first and second output transistors.

2. An apparatus comprising:
   first and second data pads arranged adjacently to each other;

third and fourth data pads arranged adjacently to each other;
a first voltage pad arranged between the first and second pads and the third and fourth pads;
first and second output drivers provided correspondingly to the first and second data pads;
third and fourth output drivers provided correspondingly to the third and fourth data pads;
a first voltage supply path including an upper level wiring connected to the first voltage pad, a first lower level wiring coupled at least to the first and second output drivers, a second lower level wiring coupled at least to the third and fourth output drivers, at least one first contact plug connecting the upper level wiring and first lower level wiring and at least one second contact plug connecting the upper level wiring and the second lower level wiring;
wherein the at least one first contact plug is arranged between the first and second output drivers and the at least one second contact plug is arranged between the third and fourth output drivers; and
wherein the first, second, third and fourth output drivers are arranged in line in a first direction in numerical order and the first voltage supply path further includes a third lower level wiring between the second and third output drivers and at least one third contact plug connecting the upper level wiring and the third lower level wiring.

3. The apparatus of claim 2, further comprising:
fifth and sixth data pads arranged adjacently to each other;
a second voltage pad arranged between the third and fourth data pads and the fifth and sixth data pads, the second voltage pad being supplied with a voltage different from a voltage supplied with the first voltage pad;
fifth and sixth output drivers provided correspondingly to the fifth and sixth data pads; and
a second voltage supply path including an additional upper level wiring connected to the second voltage pad, a fourth lower level wiring coupled at least to the fifth and sixth output drivers, and at least one fourth contact plug connecting the additional upper level wiring and the fourth lower level wiring and being arranged between the fifth and sixth output drivers.

4. The apparatus of claim 3, wherein the first and second data pads, the third and fourth data pads and the fifth and sixth data pads are in line with one another along the first direction.

5. The apparatus of claim 3, wherein the at least one second contact plug and the at least one third contact plug are arranged in line with one another along a second direction substantially orthogonal to the first direction.

* * * * *